US008008839B2

(12) United States Patent
Shubinsky et al.

(10) Patent No.: US 8,008,839 B2
(45) Date of Patent: Aug. 30, 2011

(54) SYSTEM AND METHOD OF PROVIDING A THERMALLY STABILIZED FIXED FREQUENCY PIEZOELECTRIC OPTICAL MODULATOR

(75) Inventors: Gary D. Shubinsky, Buffalo Grove, IL (US); Charles S. Pint, Evanston, IL (US)

(73) Assignee: Fluke Corporation, Everett, WA (US)

( * ) Notice: Subject to any disclaimer, the term of this patent is extended or adjusted under 35 U.S.C. 154(b) by 479 days.

(21) Appl. No.: 12/163,036

(22) Filed: Jun. 27, 2008

(65) Prior Publication Data

US 2009/0001908 A1     Jan. 1, 2009

Related U.S. Application Data

(60) Provisional application No. 60/946,653, filed on Jun. 27, 2007.

(51) Int. Cl.
*H01L 41/09* (2006.01)

(52) U.S. Cl. .......................................... 310/315

(58) Field of Classification Search .......... 310/315, 310/331, 359
See application file for complete search history.

(56) References Cited

U.S. PATENT DOCUMENTS

| | | | | |
|---|---|---|---|---|
| 3,760,203 A * | 9/1973 | Guntersdorfer et al. | ...... | 310/317 |
| 4,660,057 A * | 4/1987 | Watanabe et al. | ...... | 347/17 |
| 5,200,714 A * | 4/1993 | Hayashi | ...... | 331/66 |
| 5,239,518 A * | 8/1993 | Kazmar | ...... | 367/157 |
| 5,659,270 A * | 8/1997 | Millen et al. | ...... | 331/69 |
| 6,437,485 B1 * | 8/2002 | Johansson | ...... | 310/332 |
| 6,917,272 B2 * | 7/2005 | Valdemarsson | ...... | 336/174 |
| 2009/0316739 A1 * | 12/2009 | Yokoyama | ...... | 372/32 |

FOREIGN PATENT DOCUMENTS

| | | |
|---|---|---|
| AT | 410497 B | 5/2003 |
| DE | 38 09 284 A1 | 3/1988 |
| EP | 0969591 A1 | 5/2000 |
| EP | 1612930 A1 | 4/2006 |
| EP | 1715577 A2 | 10/2006 |
| JP | 58-048976 | 9/1981 |
| JP | 10-10309 | 7/1987 |
| JP | 2-043779 | 8/1988 |
| JP | 5-206533 | 1/1992 |
| JP | 5-206535 | 1/1992 |
| JP | 7-234329 | 2/1994 |

OTHER PUBLICATIONS

UK Search report for Application No. GB0811664.2 dated Oct. 22, 2008.

* cited by examiner

*Primary Examiner* — Thomas M Dougherty
(74) *Attorney, Agent, or Firm* — Fredrikson & Byron, P.A.

(57) ABSTRACT

A device for generating controlled vibration in an uncontrolled temperature environment includes a driving circuit that generates a signal having a first frequency and has a temperature-sensitive driving unit, a vibratory element coupled to the driving unit that vibrates at the first frequency according to the generated signal, and a temperature control circuit to control the temperature of the driving unit.

9 Claims, 5 Drawing Sheets

SYSTEM AND METHOD OF PROVIDING A THERMALLY STABILIZED FIXED FREQUENCY PIEZOELECTRIC OPTICAL MODULATOR

CROSS REFERENCE TO RELATED APPLICATIONS

This application claims the benefit of U.S. Provisional Patent Application No. 60/946,653 entitled "System and Method of Providing a Thermally Stabilized Fixed Frequency Piezoelectric Optical Modulator," filed Jun. 27, 2007, the disclosure of which is expressly incorporated herein by reference in its entirety for all purposes.

FIELD OF THE INVENTION

The disclosure generally relates to methods of optical signal modulation and, more particularly, relates to a method for stabilizing modulation in piezoelectric choppers used in optical temperature detection systems.

BACKGROUND

Piezoelectric devices are used in a variety of systems that include parts vibrating at a controlled frequency. These devices employ certain physical properties of piezoelectric crystals, also known as materials displaying the Polarized Electrostrictive Effect. In particular, piezoelectric crystals change their shape when exposed to voltage. Thus, by applying a driving circuitry to a piezoelectric material, the material can be adapted to expand and contract at the frequency associated with the driving circuit. This method of translating electrical energy to mechanical energy is used in actuators and transducers in a variety of fields.

One such field of application is optical temperature instrumentation. Generally speaking, non-contact temperature instruments allow measuring the temperature of an object at a distance and are quick to respond. These operating features are particularly helpful when measuring the temperature of an object in a harsh or dangerous environment where physical contact is not an option. Such instruments generally operate by sensing the energy emitted from objects at a temperature above absolute zero in which the radiant infrared energy emitted by the object is proportional to the fourth power of its temperature. To develop a measurement, some devices use a shield, often called a chopper, to alternately expose and block the target object to a sensor or a detector, thereby creating a modulated signal.

This function of optical modulation performed by choppers is one of the key aspects in the construction of opto-electronic sensors and in opto-electronic instrumentation in general. In optics, modulation can be used to counteract the imperfections of the circuitry, the detectors, and the medium, and further to distinguish the desired signal from the background.

A chopper used to modulate signals in an optical measurement device may be implemented in a variety of ways. There are motor-driven, opto-electronic, acousto-optical, and piezoelectric choppers. Piezoelectric choppers have the advantage of being very small in size and fairly inexpensive compared to other types of optical modulators. Moreover, as compared to other choppers, piezoelectric choppers are easier to assemble and have higher reliability. Meanwhile, motors used in motor-driven choppers are bulky and not very reliable due to the number of moving parts. Opto-electronic and acousto-optic choppers, on the other hand, have a different disadvantage of being very complicated, expensive, and often provide a relatively limited range in the so-called depth of modulation.

However, while piezoelectric choppers have the advantage of being small and simple, they also have a significant drawback. Specifically, commercially available piezoelectric choppers do not meet all of the desired performance requirements. For example, if one needs an apparatus requiring a tightly controlled modulation frequency which can operate consistently in a wide range of temperatures (between −10 C to 70 C, for instance), piezoelectric choppers will not work reliably because piezoelectric materials have a very large temperature coefficient. In other words, the electric properties of piezoelectric materials are highly sensitive to the ambient temperature. As a result, when a piezoelectric chopper is exposed to some variations in the ambient temperature, it demonstrates significant shifts in its resonant frequency, thus creating a problem in the task of achieving a reasonable stability in the signal modulation.

One of ordinary skill in the art will recognize that the response of a system will result in the largest possible amplitude when the corresponding circuit is driven at a resonant frequency associated with the system. For this reason, the manufacturers of piezoelectric choppers typically drive the circuits at the resonant frequency in order to obtain the maximum amplitude for the same applied voltage. As discussed above, the resonant frequency of a circuit involving piezoelectric materials is a function of the ambient temperature. Thus, commercially available choppers driven at the resonant frequency are inherently unstable at the modulation frequency selected as a function of the chopper temperature.

There has been an attempt in the industry to address some of the deficiencies of a piezoelectric chopper. In particular, the manufacturers sometimes deal with the problem of instability by adding a feedback sensor mechanism that obtains a measure of the modulation frequency. However, this method falls short of solving the problem for at least two reasons. First, the circuits using a feedback sensor loop introduce additional response time issues associated with the sensor feedback loop. Second, the addition of a sensor (coupler/interrupter) adds complexity to the system. Moreover, this additional subsystem typically has its own temperature coefficient which may actually compound the effect and fail to yield an accurate chopper control. In general, all feedback sensors, such as inductive, capacitive, and optical types, are sensitive to temperature and humidity. As a result, all feedback methods inherently have significant limitations.

As another alternative, chopper manufacturers sometimes choose not to deal with the temperature coefficient of piezoelectric materials and, as a result, simply do not assure the stability of the system. This lack of assurance may only be acceptable when piezoelectric choppers operate exclusively at a very narrow temperature range. However, many if not most of the industrial applications actually require instrumentation capable of working reliably within a wide range of temperatures such as 0° C. to 70° C.

DETAILED DESCRIPTION OF THE DRAWINGS

SUMMARY

A circuitry is developed to oscillate a vibratory element such as a blade enclosed between two piezoelectric crystals at a fixed operational frequency. According to some embodiments, the operational frequency is set at a fixed frequency which is slightly below the resonant frequency. The piezoelectric chopper which includes two piezoelectric crystals mounted on both sides of a stainless steel chopper blade is encapsulated in a thermostat made of copper. This type of a thermostat can also be fabricated from other suitable types of material with sufficiently high thermal conductivity properties, such as aluminum or aluminum alloys, brass, or copper alloys etc. In operation, a supplementary circuit sets the copper enclosure to a constant target temperature. In accordance with one embodiment, a processor controls the amount of current flowing through a heating resistor by processing a signal from a temperature sensor. The piezoelectric crystals are driven at the operational frequency in order to assure stable operation at a wide range of ambient temperatures.

DETAILED DESCRIPTION

Figure 1:
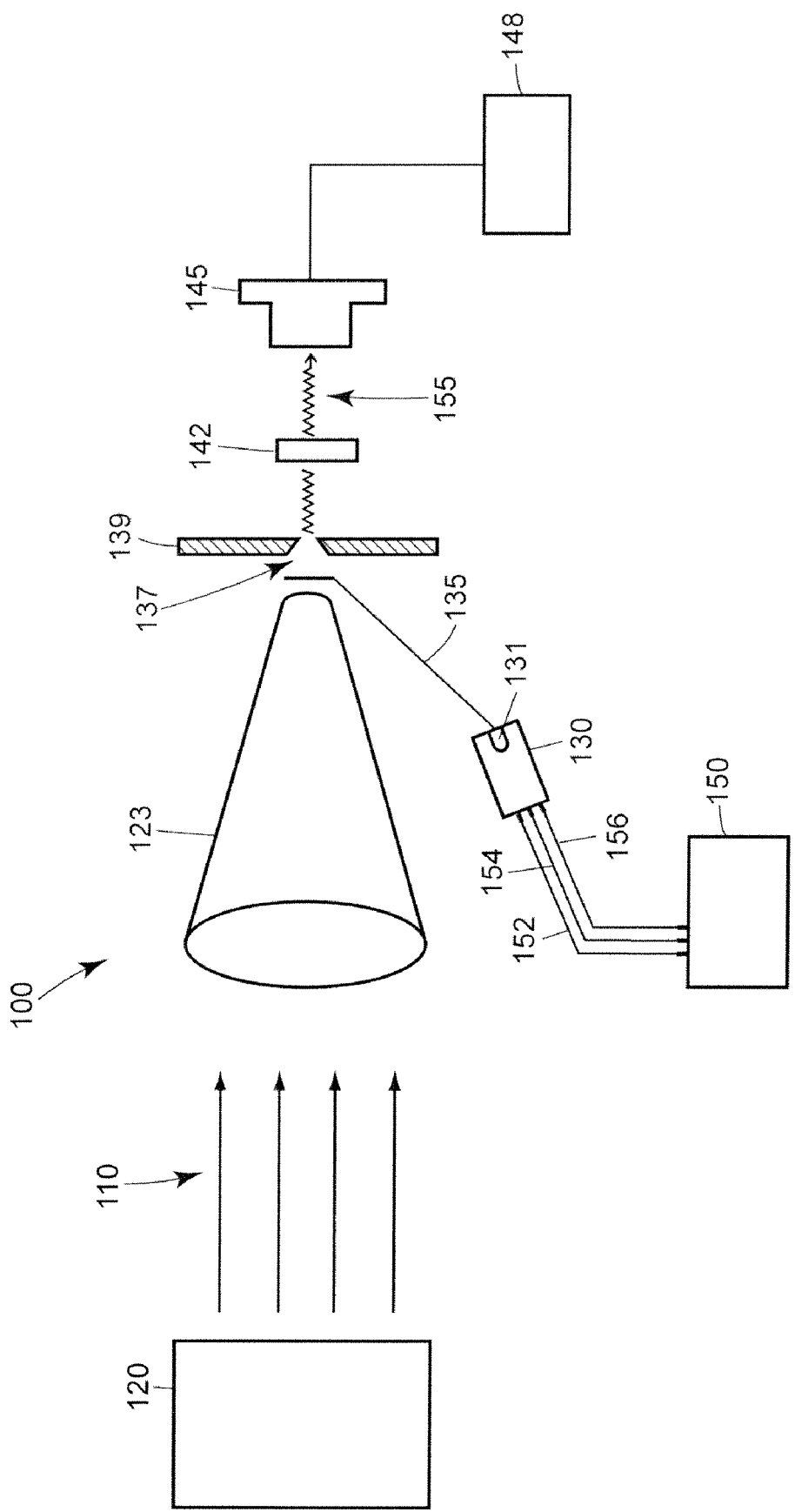
FIG. 1 is a schematic representation of an exemplary optical temperature measurement system that uses a chopper in conjunction with an aperture to modulate the radiation signal.

FIG. 1 is a schematic representation of a system 100 that may employ a piezoelectric chopper to modulate a radiation signal received from a heated object. The radiation 110 emanating from a heated objected 120 arrives at the objective lens 123. The piezoelectric chopper 130 equipped with a piezoelectric crystal unit 131 may place the blade 135 in one of at least two positions, a fully open position and a fully closed position. In an open position of the chopper 130, the blade 135 substantially completely blocks the passage of radiation through the aperture 137. The aperture 137 is an opening in the barrier 139 made of a material that completely, or nearly completely, blocks the radiation 110. Next, the radiation 110, if allowed through the aperture 137 by the blade 135, passes through an interference filter 142 before reaching a detector 145. The detector 145 may be any type of optical radiation sensor able to generate a signal indicative of the intensity of the incident optical radiation. The sensor may, for example, generate a digital signal and transmit it to a controller 148 to which it is communicatively coupled. The controller 148 may be a computer host, a microprocessor, or any other type of device or logic unit capable of processing and possibly storing data collected by the detector 145.

In one embodiment, a chopper controller 150 may control the chopper 130 via the control lines shown as 152, 154, 156. Alternatively, the chopper controller 150 and the controller 148 may be implemented as an integral unit. One of ordinary skill in the art will further appreciate that the chopper controller 150 may be implemented as part of the chopper and manufactured as a single device.

The control lines 152-156 may carry control and sensor information between the chopper 130 and the chopper controller 150. In particular, the chopper controller 150 may use the timer line 152 to drive the desired state of the blade 135 to the chopper 130. In one possible embodiment, the controller may set the voltage in line 152 to high to activate a circuit controlling the piezoelectric unit 131. The crystals in the piezoelectric unit 131 may change their shape when exposed to voltage, thereby changing the position of the blade 135 with respect to the aperture 137. Accordingly, the crystals may regain their previous shape when the voltage is no longer applied to the piezoelectric unit 131, thereby returning the blade 135 to the original position. Thus, the chopper controller 150 may control the blade position via the line 152. Meanwhile, chopper controller 150 may use the control line 154 to control a heater unit within the chopper 130. The control line 154 may be used to receive a temperature feedback signal from the chopper 130. The control line 156 may be used to control the power flowing through the transistor 275 into the heater 273 (shown in FIG. 3).

In the operational state corresponding to the open position of the blade 135, the detector 145 receives incident optical radiation 110 and, preferably, generates a signal proportional to the intensity of the optical radiation. Conversely, in the operational state corresponding to the closed position of the blade 135, the radiation 110 does not reach the detector 145 because all or substantially all of the incident rays 110 are blocked by the barrier 139 in cooperation with the blade 135. Therefore, the detector 145 will register the intensity of radiation emanating from the heated object 120 only while the blade is open and will, in a sense, receive a modulated radiation signal. In order to properly interpret the radiation measurements, the detector 145, or a controller 148 coupled to and working in cooperation with the detector 145, may need to demodulate the radiation signal. In order to successfully demodulate the signal, the detector 145 must know the frequency at which the signal is modulated. In accordance with the embodiments described above, the frequency of modulation is determined by the circuitry including the piezoelectric crystal unit 131 and is ultimately controlled by the chopper controller 150 via the control line 152. In other words, the chopper 130 in cooperation with the chopper controller 150 provides a known and controlled modulation of the incoming optical radiation. This modulated radiation is received by the optical detector, which ultimately converts the received modulated radiation to a proportional electrical signal. This modulation of the incoming optical radiation alleviates the interference problem, to name just one of the benefits of modulation methodology. Thus, the mechanical movement of the blade 135 translates the radiation 110 into a modulated radiation signal 155.

Figure 2:
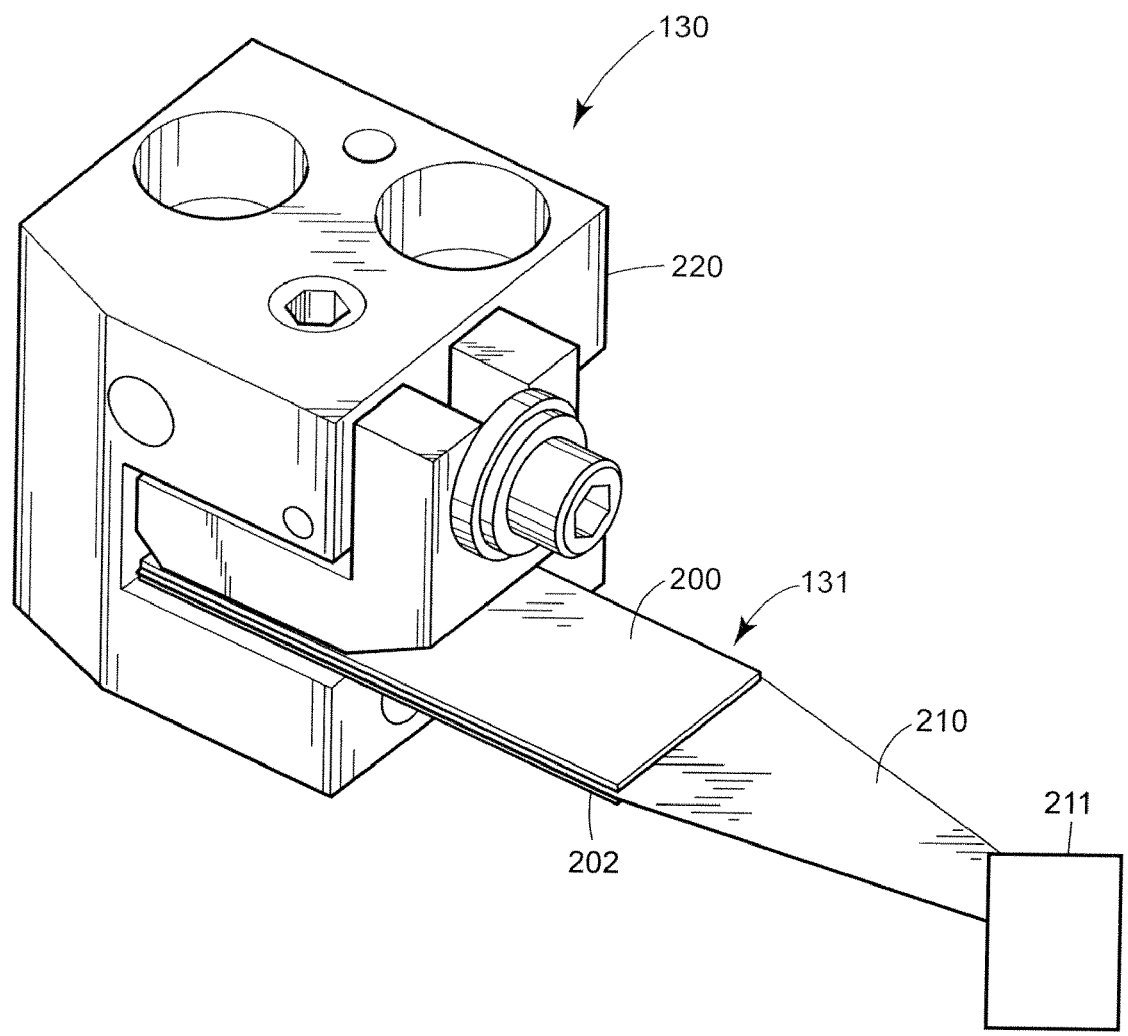
FIG. 2 illustrates a piezoelectric chopper implemented in accordance with one of the embodiments of the present disclosure.

One possible embodiment of the chopper 130 is illustrated in FIG. 2. The piezoelectric unit 131 may consist of two piezoelectric crystals, or wafers 200 and 202. Some of the piezoelectric materials which can be used to manufacture the crystals 200 and 202 are, for example, lead-zirconate-titanate (PZT), lead-titanate ($PbTiO_2$), lead-ziconate ($PbZrO_3$), and Barium Titanate ($BaTiO_3$). The opposite polarities from a voltage source are applied to the crystals 200 and 202. As illustrated in FIG. 2, the crystals may be shaped into substantially flat plates in order to enclose a metal blade 210. However, the piezoelectric crystals 200 and 202 may be also shaped in a variety of ways that allow translating the motion of expanding and contracting into any kind of lateral, vertical, or rotational motion. One of ordinary skill in the art will further appreciate that any of these types of motion may be used to align a blade of a chopper with an aperture in order to selectively block and unblock the passage of radiation. In the embodiment shown in FIG. 2, the blade 210 may be sandwiched between the piezoelectric crystals 200 and 202 so that the crystals essentially perform a push-pull operation under voltage: when one is contracting, the other one is expanding, and vice versa. In the embodiment depicted in FIG. 2, the blade 210 additionally includes a plate 211 that approximately corresponds to the dimensions of the aperture 137. The same principle of operation can be applied to a chopper configuration which includes two modulators operating in a "scissors"-like fashion.

More specifically, when voltage is applied to the piezoelectric unit 131, one piezoelectric wafer 200 decreases in thickness and increases in length, while the other wafer 202 increases in thickness and decreases in length, thus resulting in a bending moment. For this reason, the piezoelectric unit, or modulator 131 may also be described as a piezoelectric bender. More generally, the modulator 131 may be any type of a suitable driving unit capable of communicating vibratory motion to a solid element (e.g., the blade 210) and responsive to variations in the ambient temperature.

In manufacturing of the blade 210, stainless steel may be selected because of its metallurgical properties. It is preferable that the chopper blades be made from materials with practically no appreciable "memory" over the range of the chopper blade motion. Thus, an embodiment including a blade made using one of these materials may be useful in adaptive optics, Digital Light Processors (DLPs), etc.

In order to block and unblock the aperture, the range of motion of the blade 210 must be sufficiently large. This range of motion is essentially determined by the amplitude of the current produced by the circuitry associated with the piezoelectric crystals 200 and 202. The amplitude, in turn, is effected by the frequency at which the circuit is driven. As one skilled in the art will immediately recognize, the frequency response of an electric circuit may describe a non-linear relationship between the frequency and the amplitude. Therefore, a frequency must be chosen and controlled in view of the desired amplitude. In the case of the chopper 130, the driving frequency may be chosen to arrive at an acceptably large range of motion of the blade 210. Even more importantly, it is desirable to provide a driving frequency such that the behavior of the system is stable, i.e., the same amplitude and therefore the same range of motion are maintained over relatively long periods of time.

The frequency response of the chopper 130 is predominantly affected by the geometry of the blade (thickness and length of the blade), material properties of the blade, thickness, length and type of the piezoelectric crystals and lastly by the thickness and material properties of the adhesive materials used during the integration of the piezoelectric crystals and the blade. In order to achieve higher amplitudes and higher frequency, one can vary the dimensions of the crystal or of the blade or both. The driving voltage 292 also controls the amplitude of the chopper. Additionally, the temperature of the encasement 220 has an effect on both amplitude and resonant frequency of the associated circuit. As mentioned above, the circuit that includes the piezoelectric crystals 200 and 202 can be characterized by its resonant frequency. When driven at its resonant frequency, a circuit will produce the largest amplitude that the circuit is capable of producing. For this reason, it is desirable to drive a piezoelectric chopper near its resonant frequency while maintaining stability in a wide range of temperature conditions.

The stability of the frequency response of the chopper 130 may be provided by the encasement 220 which is heated to a certain control temperature by a heater circuit and maintained at or near this control temperature by a thermostat circuit. Both the heater circuit and the thermostat circuit may be controlled by the chopper controller 150. The encasement 220 may be made of copper because of the metallurgical qualities of this metal. However, other metals or alloys that have similar physical properties may be used. Additionally, the encasement 220 may not be implemented as a solid or contiguous block. For instance, a plurality of resistors spaced apart at a predetermined distance may also be used to create an area in which temperature is reliably maintained at a target level.

Figure 3:
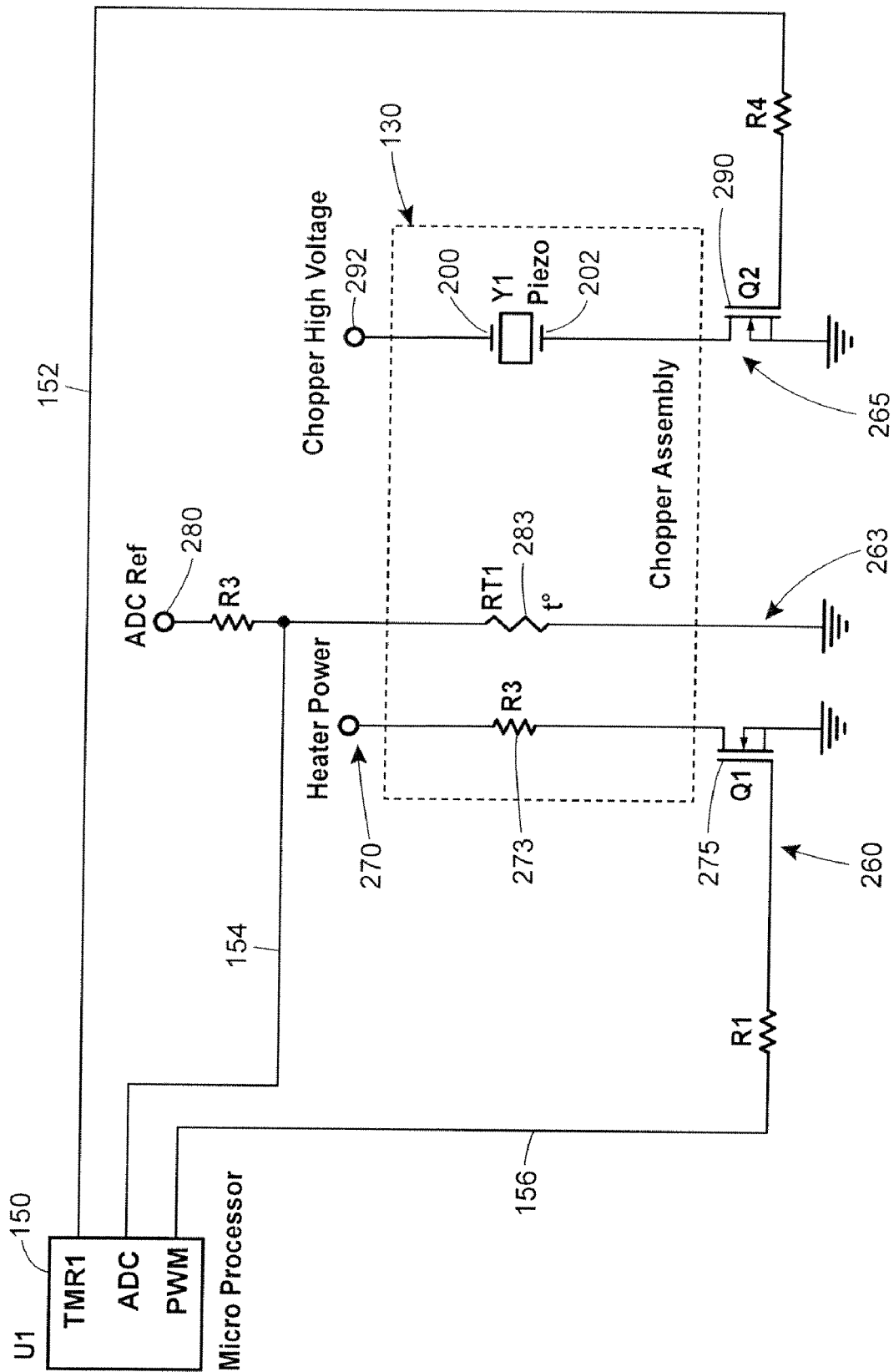
FIG. 3 is an exemplary schematic representation of the circuitry that stabilizes the modulation of a piezoelectric chopper.

A chopper circuitry corresponding to one of the possible embodiments is illustrated in FIG. 3. The chopper controller 150 is connected to the chopper 130 through the control lines 152-156. A heater circuit 260, a temperature-sensing circuit 263, and a high-voltage driving circuit 265 perform the three respective functions of heating, reporting the temperature back to the chopper controller 150, and applying voltage to the piezoelectric crystals 200 and 202 to move the blade at a predetermined frequency. The voltage sources servicing each of the circuits may be disposed away from the chopper 130. Alternatively, the chopper controller 150 may provide voltage to some or all of the circuits.

In operation, the voltage source 270 may provide voltage to the heater circuit 260. The resistor 273 will generate heat when the heater transistor 275 is in the on state and electric current passes through the resistor 273. In general, any type of thermoelectric material, or any device able to convert electricity to heat may be used as part of the heater circuit 260. The chopper controller may activate the switch 275 via the line 156 in order to open or shut off the flow of electric current in the heater circuit 260. The controller may decide when to activate the switch 275 depending on the output of the temperature sensing circuit 263.

More specifically, the temperature sensing circuit 263 may be powered by the voltage source 280. A temperature sensor 283 may provide the reading of the temperature inside the chopper 130 to the chopper controller 150 via the control line 154. The element 283 may be any type of temperature sensor. In one aspect, the temperature sense circuit 263 provides a feedback signal to the chopper controller 150 indicative of the temperature to which the heater circuit 260, in particular the resistor 273, has raised the encasement 220 or the entire chopper 130.

In one embodiment, the temperature sensing circuit 263 may also be implemented using an on-chip thermistor as the thermostat 283. The resistance of a thermistor will change in accordance with the changing temperature. Thus, the temperature sensing circuit 263 may be adapted to measure the changes in electric current indicative of the changes in the resistance of the thermistor 283. In particular, a signal indicative of the current strength may be supplied to the chopper controller 150 via the control line 154. The chopper controller 150 may in turn calculate the temperature based on a pre-programmed set of parameters related to the temperature sense circuit 263. Alternatively, the temperature sensing circuit 263 may be adapted to supply, via the control line 154, a signal indicative of the temperature sensed by the thermistor 283, thereby eliminating the need to program the chopper controller 150 with a set of parameters related to the temperature sensing circuit 263. Importantly, a thermistor is typically sensitive to differences in temperature measured in a fraction of a degree. Therefore, a thermistor may be advantageous for establishing a relatively high degree of accuracy, such as one with the margin of error of approximately 0.1° C.

The chopper controller 150 may be programmed with a predetermined temperature at which the chopper 130, or parts of the chopper, such as the encasement 220, must be maintained. The value may be stored in a permanent memory, a read-only memory (ROM), or a random access memory (RAM) of the chopper controller 150. Additionally, the chopper controller may be equipped with an interface through which a human operator may enter the desired value of a target temperature. Moreover, the chopper controller 150 may further store or accept via user interface the margin of error associated with the target temperature. For example, a design engineer or an operator may decide that the target temperature should be 65° C. and the associated margin of error 1° C. Based on these values, the chopper controller 150 will consider the temperatures between 64° C. and 66° C. to be substantially on target. Because piezoelectric materials are not very sensitive to small variations in temperature (such as ones under 1° C.), an error within this error margin will not have a significant impact on the performance of the system.

Initially, the chopper controller 150 may turn on the heater circuit 260 and begin to continuously or periodically check the signal received over the line 154. When the temperature reaches the acceptable range determined according to the principle discussed above, the chopper controller 150 may deactivate the heater circuit 260, thereby allowing the resistor 273 to cool off until the thermostat circuit 163 reports a low or borderline low temperature. At this point, the heater circuit 260 may be activated again to raise the temperature to within the acceptable range. Alternatively, a pulse-width modulator (PWM) signal may be integrated into a heater circuitry to control the thermostat heating function.

The control circuit 265 may operate independently of the heater circuit 260 and of the thermostat circuit 263. Moreover, the control circuit 265 may be adapted from an existing chopper assembly to reduce the cost of developing a thermally stabilized fixed frequency system as discussed herein. According to one possible embodiment, the encasement 220 along with the heater circuit 260 and 263 may be provided as a single unit adapted to work in conjunction with a legacy piezoelectric chopper device and a controller.

In the embodiment illustrated in FIG. 3, the control circuit 265 includes the piezoelectric unit 131 including at least of two piezoelectric crystals 200 and 202, the control line 152, the switch 290, and the voltage supply 292. The chopper controller may drive the control circuit 265 at an operational frequency $F_{operational}$. For example, the controller may turn off 290 to prevent the flow of current from the voltage supply 292 to the piezoelectric crystals 200 and 202. In another operational state, the controller may use the control line 152 to turn on the switch 290 and allow the flow of current from the voltage supply 292 to the piezoelectric crystals 200 and 202. The frequency at which the controller toggles the switch 292 may, in effect, determine the operational frequency $F_{operational}$ of operation of the control circuit 265.

In another embodiment, an external frequency generator may be used. In this case, the controller may not be responsible for driving the chopper circuit 265. Moreover, the chopper circuit 265 may not include the switch 265 or, in accordance with another embodiment, the control circuit 265 may be adapted to operate both with the controller and with an external frequency generator in order to allow operators to choose a configuration suitable for a particular implementation.

Figure 4:
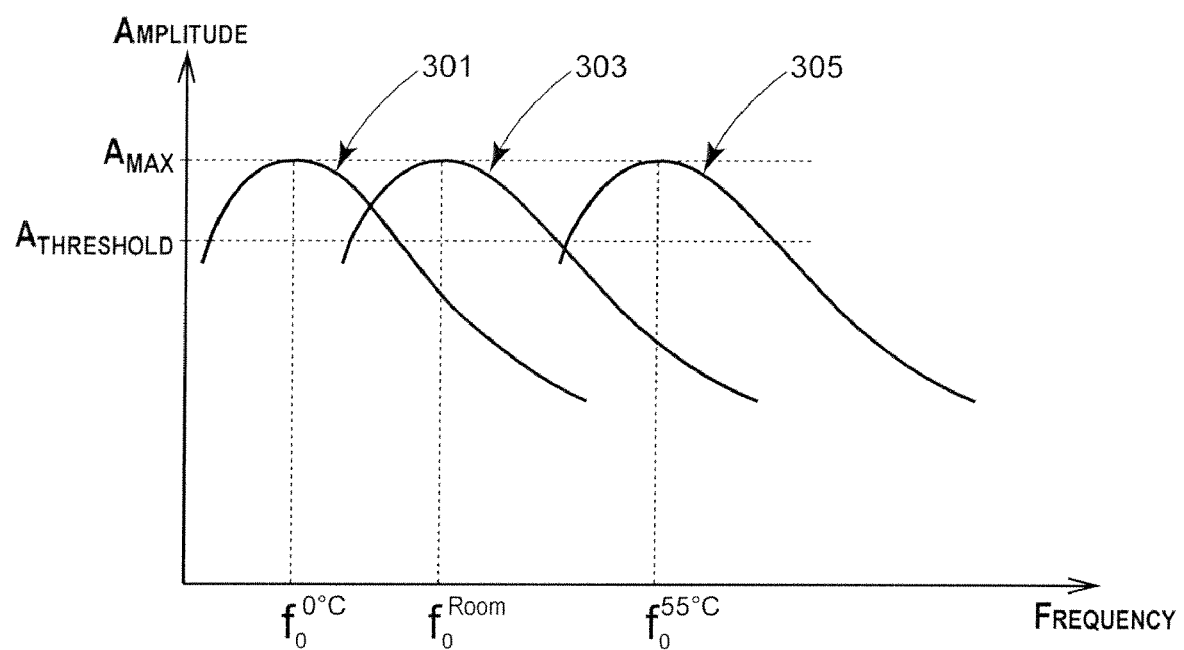
FIG. 4 is a graph illustrating the shift in resonant frequency in a piezoelectric material exposed to various ambient temperatures.

The frequency $F_{operational}$ may be determined in accordance to the following formula:

$$F_{operational} = F_0 - F_{offset},$$

where $F_0$ is the resonant frequency of the control circuit 265 and $F_{offset}$ is a small offset, (as an example: 2 Hz). The offset may be adjusted to a smaller or larger value according to the acceptable tradeoff between the desired chopper amplitude and stability. Prior to applying the formula, the resonant frequency $F_0$ must be determined. However, because piezoelectric materials are sensitive to ambient temperatures, the resonant frequency $F_0$ of the associated circuit shifts as illustrated in FIG. 4.

In particular, several possible responses of a circuit including a pair of piezoelectric crystals 200 and 202 are depicted as curves 301-305. Each of the curves 301-305 illustrates the general relationship between an amplitude of the signal associated with the current and the driving frequency applied to the circuit. The curve 301 corresponds to the amplitude produced by a circuit, such as the control circuit 265, at 0° C. The highest amplitude $A_{max}$ occurs when the driving frequency is equal to the resonant frequency, which at this temperature corresponds to $F_0^{0°}$. At room temperature (such as 20° C.), the same circuit may generate the same maximum amplitude $A_{max}$ but at a different frequency. The curve 303 shows that the curve 301 shifts to the right and $A_{max}$ now corresponds to $F_0^{room}$. Further, the curve 305 shows the same circuit operating at the temperature of 55° C. The maximum amplitude occurs $A_{max}$ occurs at the resonant frequency which has now become $F_0^{55°}$.

It is important to note that as the temperature changes and the curve shifts to the left or to the right, the shape of the curve stays the same. Due to this property, the desired characteristics of a system that includes piezoelectric elements may be obtained by controlling the temperature which, as shown above, determines the resonant frequency of the system. In particular, another amplitude, $A_{threshold}$, may be defined as the minimum acceptable amplitude. This amplitude may be selected to be substantially close to $A_{max}$. A system may be designed to operate at $A_{threshold}$ as opposed to $A_{max}$ to accommodate a relatively small error in operation. As shown in FIG. 4, $A_{threshold}$ shifts by the same number of Hertz as the resonant frequency corresponding to the same temperature curve. Thus, when controlling the temperature of a device housing the control circuit 260, only the new resonant frequency needs to be determined without determining the complete response curve for the new temperature.

The value corresponding to $F_{operational}$ may be obtained as part of the design stage by means of a calculation or by experimentation. Importantly, $F_{operational}$ corresponds to a certain temperature because the resonant frequency, from which $F_{operational}$ depends, shifts as the temperature changes. In one embodiment, the operational frequency with the 3 Hz offset is determined at the temperature of 65° C.:

$$F_{operational} = F_0^{65°} - 1 \text{ Hz}.$$

Varying the temperature within several degrees will not significantly affect the amplitude because the curve describing the relationship between the amplitude and the frequency, such as the ones shown in FIG. 4, is not so steep as not to allow a margin of error of several degrees. The experiments have further confirmed that this temperature range is acceptable.

While the chopper controller 150 may drive the control circuit 265 at the resonant frequency, a small error occurring during operation may cause the amplitude to "fall off" the acceptable amplitude range. Because the amplitude decreases exponentially as the driving frequency moves higher away from the resonant frequency, an error near the resonant frequency results in a very large difference in amplitude as measured in absolute terms. Therefore, driving the control circuit 265 at a frequency which is slightly below the resonant frequency protects the system from generating an unacceptable amplitude due to small variation temperature or frequency.

In accordance with another embodiment, the chopper controller 150 may perform a diagnostic routine to determine the resonant frequency and subtract from it the offset value ($F_{offset}$) arrive at the operational frequency. The chopper controller 150 may perform the measurement after the chopper 130 reaches the target temperature. Alternatively, the chopper controller 150 may determine the resonant frequency at room temperature and adjust the value accordingly if the dependency of resonant frequency on temperature is known and programmed into the controller.

Further, it is contemplated that if the chopper 130 is used in ambient temperatures exceeding the target temperature set by the chopper controller 150 by means of controlling the heater circuit 260, the resonant frequency of the control circuit 150 may shift. In order to accommodate these conditions, the target temperature may be reprogrammed to exceed the ambient temperature. In another embodiment, the heater circuit 260 may be replaced with a coolant circuit that may be used to maintain the temperature of the chopper at a steady value.

Figure 5:
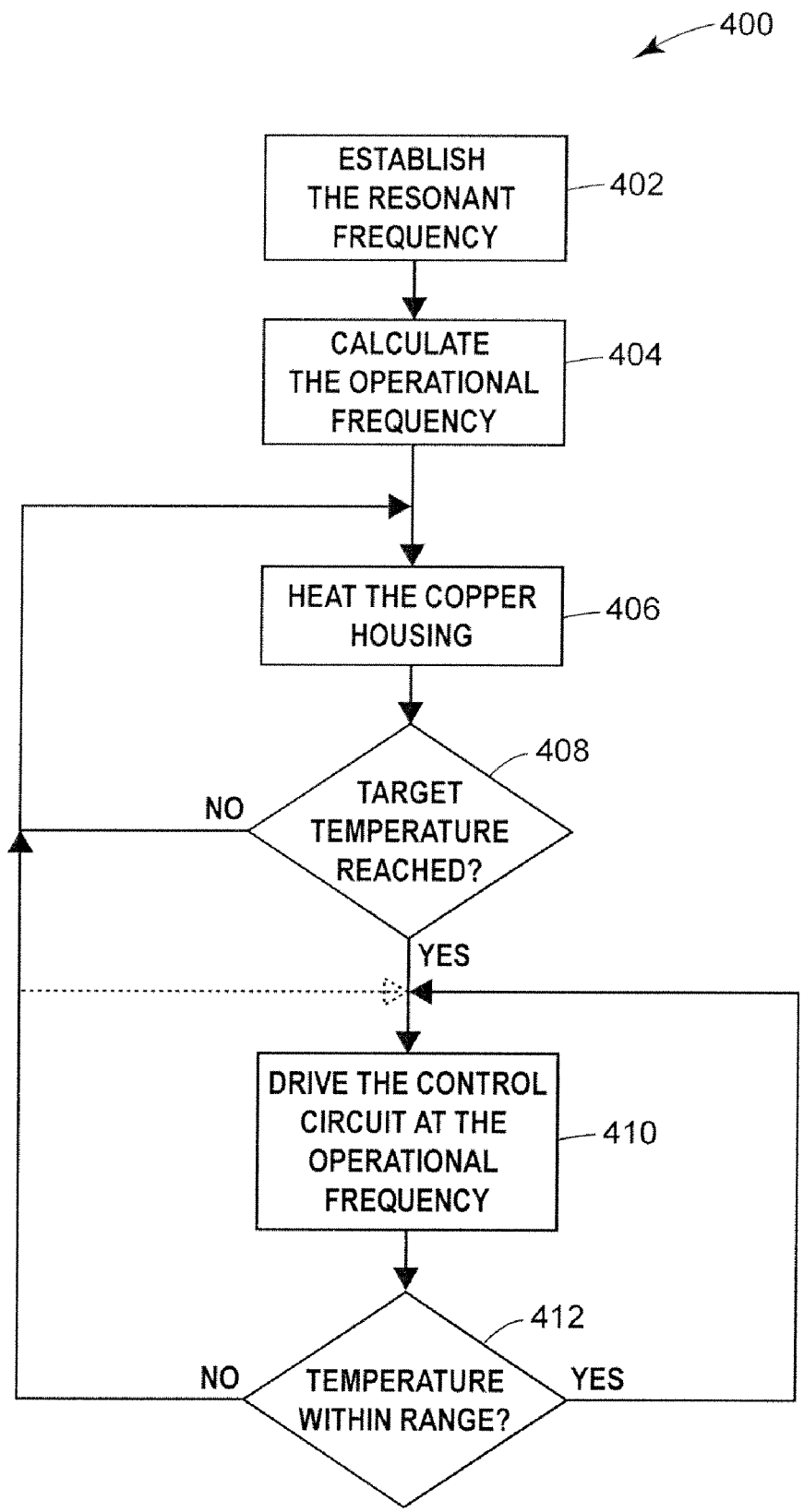
FIG. 5 is an exemplary block diagram illustrating the procedure of thermally stabilizing a piezoelectric modulator.

FIG. 5 is a diagram illustrating the method 400 consistent with one or more embodiments of the current invention. The method may be implemented as a single procedure in the chopper controller 150. Alternatively, some of the operations may be executed outside the controller or by other devices.

At block 402, the controller establishes the resonant frequency of the circuit. As discussed above, the controller may perform the procedure autonomously or receive a predetermined value. At block 404, the controller may subtract the offset value from the resonant frequency to arrive at the operational frequency.

Next, in block 406, the controller begins to heat the chopper housing to a target temperature. The heat may be conveyed to the housing in one of the plurality of ways, such as by means of an electric circuit supplying current to a heating element or a resistor enclosed in the housing, During heating, the chopper controller receives the reading from a temperature sensor reporting the current temperature. The controller compares the target temperature value to the current value in block 406.

In another embodiment, the controller may not use a feedback mechanism such as a sensor. In certain situations, the temperature of the chopper housing may be sufficiently accurately estimated based on the amount of current or heat supplied to the housing. In this embodiment, the controller may skip steps 406-408 and proceed directly to block 410.

Once the target temperature is reached, the controller may start driving the circuit at the frequency determined in block 404. The operational frequency calculated according to the principles set forth above and the thermally stable environment in which piezoelectric crystals operate assures a stable, reliable modulation. Specifically, the piezoelectric crystals residing at a constant temperature will oscillate at the same frequency when a constant driving frequency is applied to the associated circuit. These oscillations will, in turn, communicate the motion to the chopper blade which will produce stable modulation of a signal.

The controller may periodically or continuously receive temperature readings. At block 412, the controller will cause the heater circuit to generate more heat if the measured temperature is outside the acceptable range. In one embodiment, corresponding to the dotted line in FIG. 5, the controller will continue driving the chopper circuit while adjusting the temperature. However, it may be desirable in other embodiments to suspend the operation of the controller circuit for safety reasons until the temperature properly stabilizes. If, on the other hand, the temperature measured in block 412 is acceptable, the controller will continue driving the chopper circuit.

In accordance with one possible embodiment, the chopper 130 is used as a modulator modulating the optical radiation signal 110 at 270 Hz. However, a modulator implemented as a piezoelectric chopper according to some of the embodiments discussed herein may also be used in a variety of other modulation requirements. Due to the low cost and small size of piezoelectric choppers, thermally stabilized fixed frequency modulators may be also used in those fields and industries that require substantially higher or lower modulation frequencies. By varying the physical dimensions of piezoelectric crystals, geometry of the chopper blades and the types of the bonding materials utilized in integration of the chopper blade and piezoelectric crystals, the methods discussed above may be applied to produce modulators operating at a very wide range of frequencies.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

What is claimed is:

1. A device for generating controlled vibration, the device comprising:

a driving circuit that generates a signal having a first frequency; wherein the driving circuit includes a temperature-sensitive driving unit;

a vibratory element coupled to the driving unit that vibrates at the first frequency according to the generated signal;

a temperature control circuit to control the temperature of the driving unit, a temperature sensing circuit that generates a signal indicative of the temperature of the driving unit; and a controller coupled to the driving circuit, to the temperature circuit, and to the temperature control circuit, wherein the controller controls the driving circuit first frequency based on the signal generated by the temperature sensing circuit.

2. The device of claim 1, wherein the temperature sensing circuit includes a thermistor having a margin of error of approximately 0.1° C. or less.

3. The device of claim 1, wherein the temperature control circuit includes:

a resistor that generates heat when voltage is applied across the resistor; and an electric switch that controls the resistor by applying voltage to the resistor in a first operational state and not applying voltage to the resistor in a second operational state.

4. The device of claim 1, wherein the driving unit is a piezoelectric transducer including a pair of piezoelectric crystals shaped as substantially flat plates such that the vibratory element resides between the piezoelectric crystals; and wherein the driving circuit applies opposite voltage polarities to each of the pair of piezoelectric crystals during operation of the device.

5. The device of claim 4, wherein the piezoelectric crystals are manufactured from one of lead-zirconate-titanate (PZT), lead-titanate ($PbTiO_2$), lead-ziconate ($PbTiO_3$), or Barium Titanate ($BaTiO_3$).

6. The device of claim 4, wherein the first frequency is determined according to the formula $$F_{operational} = F_0 - F_{offset}, \text{ wherein}$$

$F_{operational}$ is the frequency $F_o$ is the resonant frequency of the driving circuit when the vibratory element is coupled to the driving circuit and associated with an operational temperature; and $F_{offset}$ is a value corresponding to a small change in the amplitude of the vibratory element when the driving circuit operates at $F_{operational}$.

7. The device of claim 6, wherein $F_{offset}$ is between 1 Hz and 3 Hz; and wherein the operational temperature is approximately 65° C. with a margin of error of 1° C.

8. A device for generating controlled vibration, the device comprising:

a driving circuit that generates a signal having a first frequency;

wherein the driving circuit includes a temperature-sensitive driving unit;

a vibratory element coupled to the driving unit that vibrates at the first frequency according to the generated signal;

a temperature control circuit to control the temperature of the driving unit; and an encasement having high thermal conductivity that substantially surrounds the driving unit, wherein the temperature control circuit maintains the encasement at a controlled temperature to thereby control the temperature of the driving unit.

9. The device of claim 8, wherein the encasement is made of copper.

* * * * *